(12) United States Patent
Culler (10) Patent No.: US 6,411,121 B1
(45) Date of Patent: Jun. 25, 2002

(54) SYSTEMS AND METHODS FOR ADJUSTING SIGNAL TRANSMISSION PARAMETERS OF AN INTEGRATED CIRCUIT

(75) Inventor: Jason Harold Culler, Livermore, CO (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 09/571,243

(22) Filed: May 16, 2000

(51) Int. Cl.⁷ .................. H03K 17/16; H03K 19/003
(52) U.S. Cl. .................. 326/30; 326/83; 710/32
(58) Field of Search .................. 326/30, 83, 86, 326/90; 710/32; 375/296, 346

(56) References Cited

U.S. PATENT DOCUMENTS 6,229,335 B1 * 5/2001 Huang et al. .................. 326/30
6,239,617 B1 * 5/2001 Guertin et al. ................ 326/81

* cited by examiner

Primary Examiner—Michael Tokar
Assistant Examiner—Daniel D. Chang

(57) ABSTRACT

A preferred method includes the steps of: sampling at least one of the signals at the chip pad (12, 404, 406) corresponding thereto to detect signal reflections, and; adjusting the at least one of the signals at the chip pad so that line delay and/or signal reflections are modified. So provided, performance of the integrated circuit (10, 402) is improved as compared with the performance of the integrated circuit prior to the step of adjusting. Systems also are provided.

21 Claims, 9 Drawing Sheets

SYSTEMS AND METHODS FOR ADJUSTING SIGNAL TRANSMISSION PARAMETERS OF AN INTEGRATED CIRCUIT

BACKGROUND OF THE INVENTION

1. Field of the Invention

The present invention generally relates to integrated circuits and, in particular, to systems and methods for adjusting signal transmission parameters of an integrated circuit.

2. Description of the Related Art

Integrated circuits (IC's) are electrical circuits which incorporate transistors, resistors, capacitors, and other components onto a single semiconductor "chip" in which the components are interconnected to perform a given function. Typical examples of IC's include microprocessors, programmable logic devices (PLDs), electrically erasable programmable memory devices (EEPROMs), random access memory devices (RAMs), operational amplifiers and voltage regulators, among others. Generally, IC's incorporate chip pads which are configured for enabling electrical interconnection of external electronic components, such as drivers, for example, with internal components, such as receivers, for example.

A driver associated with an IC typically is configured for providing a signal to a chip pad of the IC via a transmission line. The signal then is provided via the chip pad, and possibly by use of additional transmission lines and/or busses, for example, to a receiver component. During transmission of the signal from the driver to the receiver, mismatches between the driver and the various signal transmission media, and between the receiver and the various signal transmission media may produce signal reflections at the driver end and/or the receiver end signal transmission path associated with the chip pad. These signal reflections may propagate along the transmission path and may potentially result in less than desired electrical performance of the chip.

Additionally, mismatches or variations in transmission paths, i.e., variations between transmission paths of various chip pads of an IC, may result in variations of driver/line signal delays received at a bus of the IC. The collective difference between all pad/line delays, known as bus skew, also may potentially result in less than desired electrical performance of the chip.

Heretofore, it is known to attempt to reduce signal reflections and/or adjust bus skew by controlling groups or blocks of chip pads together based on process, voltage, temperature (PVT) information, such as by applying resistor/impedance components to external pins of the chip to alter driver/receiver impedance of a block of chip pads. Thus, by averaging the PVT information of one area of the chip, the block of pads corresponding to that area may be controlled through the use of one set of external pins. Since chip pads, however, may possess defects/flaws and/or impedances that are different from each other (even different from those of other chip pads in the same block of chip pads), it would be beneficial, in some respects, to provide additional external pins to a chip so that each chip pad could be independently altered, such as by applying resistor/impedance components to external pins of each chip pad, as necessary. However, to invoke the use of such additional external pins would require the use of additional circuits and busses, and would require reallocation of chip resources, such as chip space and routing resources, for example, thereby making such resources unavailable for critical signals, such as clocks, for instance.

Therefore, there is a need for devices, systems and methods which address these and other shortcomings of the prior art.

SUMMARY OF THE INVENTION

Briefly described, the present invention generally relates to systems and methods for adjusting signal transmission parameters of an integrated circuit. In a preferred embodiment, the system includes an integrated circuit incorporating a first chip pad, a first receiver, and process, voltage and temperature (PVT) controls. The first chip pad electrically communicates with the first receiver, with the first chip pad and the first receiver forming at least a portion of a first signal transmission path. The PVT controls are configured to adjust driver delay and/or receiver impedance based upon on-chip conditions of the integrated circuit. Additionally, a controller electrically communicates with the first chip pad, with the controller being configured to sample a first signal corresponding to the first chip pad and adjust the first signal so that line delay and/or signal reflections associated with the first signal are modified, thus, improving performance of the integrated circuit.

In another embodiment, the system includes an integrated circuit incorporating a first chip pad, a first receiver, and process, voltage and temperature (PVT) controls. The first chip pad electrically communicates with the first receiver, with the first chip pad and the first receiver forming at least a portion of a first signal transmission path. The PVT controls are configured to adjust driver delay and/or receiver impedance based upon onchip conditions of the integrated circuit. Additionally, means for sampling a first signal corresponding to the first chip pad and adjusting the first signal is provided so that line delay and/or signal reflections associated with the first signal are modified, thus, improving performance of the integrated circuit.

In another embodiment, the present invention may be generally construed as a method for adjusting signals. Briefly stated, the method preferably includes the steps of: sampling at least one of the signals at the chip pad corresponding thereto to detect signal reflections; and adjusting the at least one of the signals at the chip pad so that line delay and/or signal reflections are modified. So provided, performance of the integrated circuit is improved as compared with the performance of the integrated circuit prior to the step of adjusting.

Other features, and advantages of the present invention will become apparent to one with skill in the art upon examination of the following drawings and detailed description. It is intended that all such features, and advantages be included herein within the scope of the present invention, as defined in the appended claims.

BRIEF DESCRIPTION OF THE SEVERAL VIEWS OF THE DRAWINGS

The present invention, as defined in the claims, can be better understood with reference to the following drawings. The drawings are not necessarily to scale, emphasis instead being placed on clearly illustrating the principles of the present invention.

DETAILED DESCRIPTION OF A PREFERRED EMBODIMENT

Figure 1:
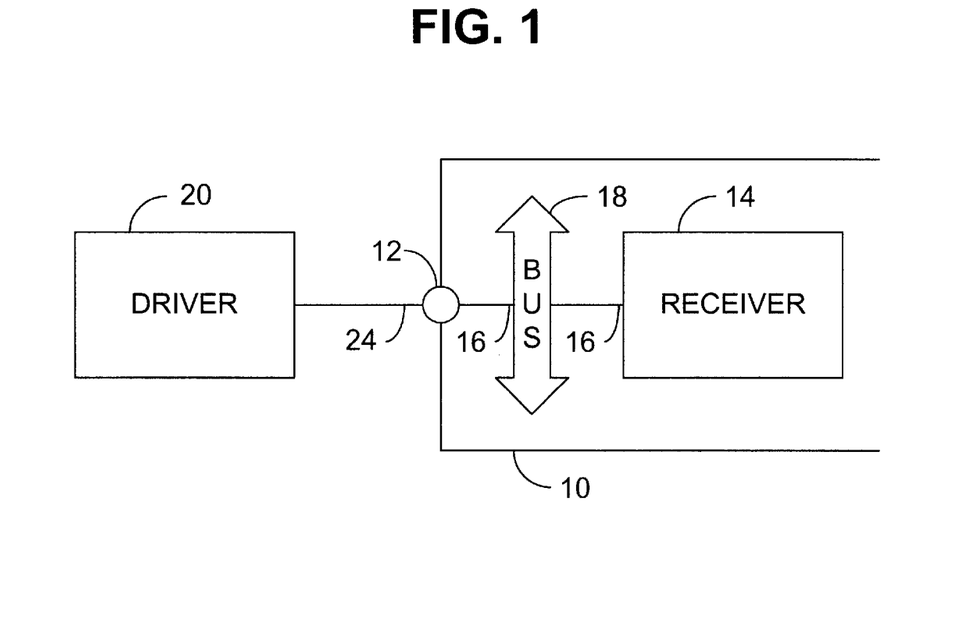
FIG. 1 is schematic diagram depicting a representative chip pad and chip pad signal transmission path.

Reference will now be made in detail to the description of the invention as illustrated in the drawings with like numerals indicating like parts throughout the several views. As mentioned hereinbefore, the present invention relates to systems and methods for adjusting signal transmission parameters of an integrated circuit (IC), such as for reducing signal reflections and/or adjusting bus skew. As depicted in FIG. 1, a representative IC 10 includes a chip pad 12 and a receiver component, such as receiver 14. Chip pad 12 electrically communicates with the receiver 14 via a transmission line 16 and/or bus(ses) 18. Additionally, a driver 20 is depicted which is configured to electrically communicate with the chip pad via transmission line 22. So configured, a signal may be delivered from driver 20 and to receiver 14 via a signal transmission path 24 which may include: one or more transmission lines 22; chip pad 12; one or more transmission lines 16, and; one or more busses 18.

Figure 2:
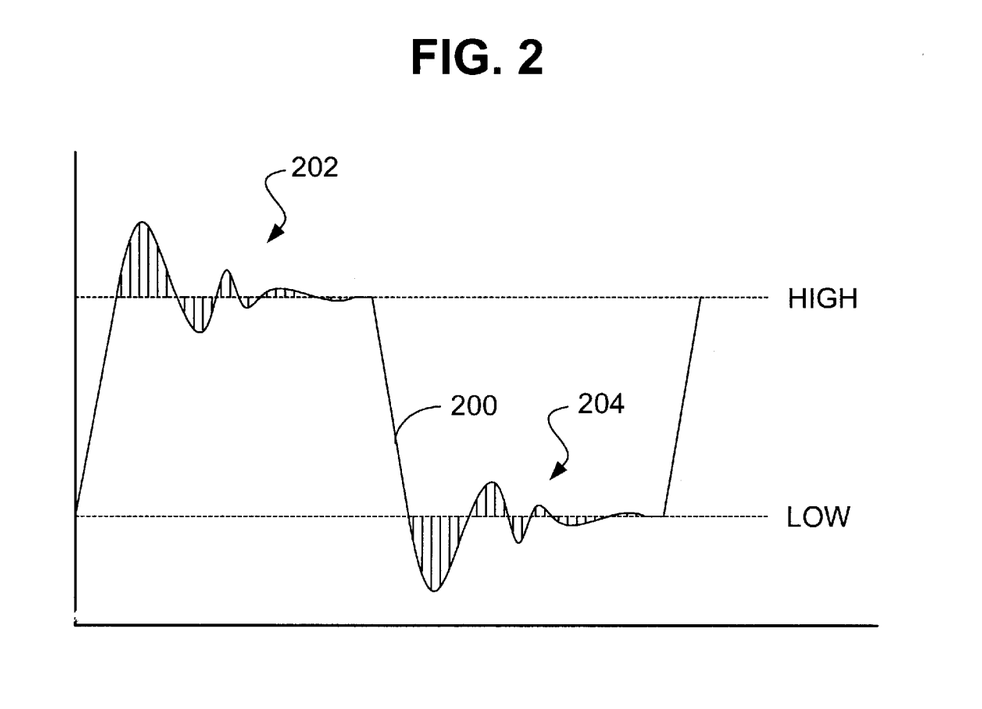
FIG. 2 is a graph depicting representative signal reflections.

As mentioned hereinbefore, mismatches between the driver and the various signal transmission media of the signal transmission path, and between the receiver and the various signal transmission media of the signal transmission path may produce signal reflections at the driver end and/or the receiver end of the signal transmission path. These signal reflections may propagate along the transmission path and may potentially result in less than desired electrical performance of the chip. A representative signal 200 including such signal reflections, i.e., reflections 202 and 204, is depicted in FIG. 2. Such reflections may cause additional noise and ringing, and incorrect data to be transmitted, and received, for example. Additionally, mismatches or variations in transmission paths, i.e., variations between transmission paths of various chip pads of an IC, may result in variations of driver/line signal delays received at a bus of the IC, and also may result in less than desired electrical performance of the chip, such as incorrect data to be received at the receiver, for instance.

Figure 3:
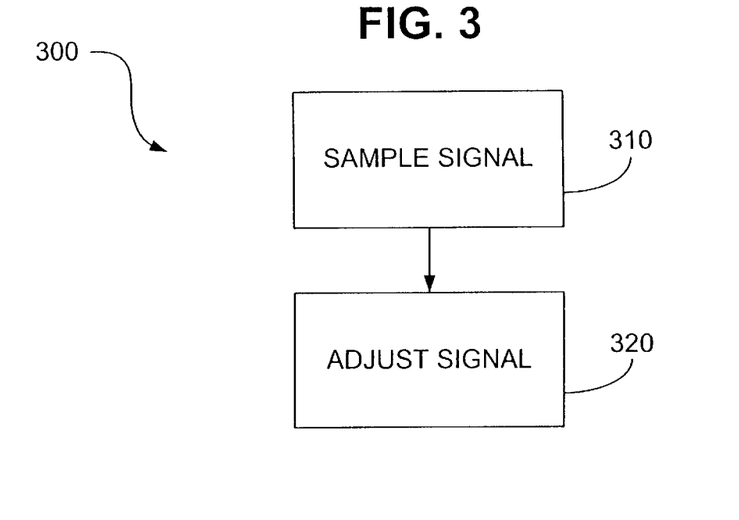
FIG. 3 is a flow diagram depicting a preferred method of the present invention.

As shown in FIG. 3, preferred method 300 for adjusting signal transmission parameters of an integrated circuit includes sampling a signal (depicted in block 310) along the signal transmission path, such as at a chip pad. Sampling of the signal preferably includes detecting and evaluating signal reflections (described in detail hereinafter) which are propagated along the transmission path. Proceeding to block 320, signal transmission characteristics may be adjusted in order to achieve desired signal transmission characteristics. Such desired signal transmission characteristics may include reducing signal reflections and/or adjusting bus skew, for example.

Figure 4:
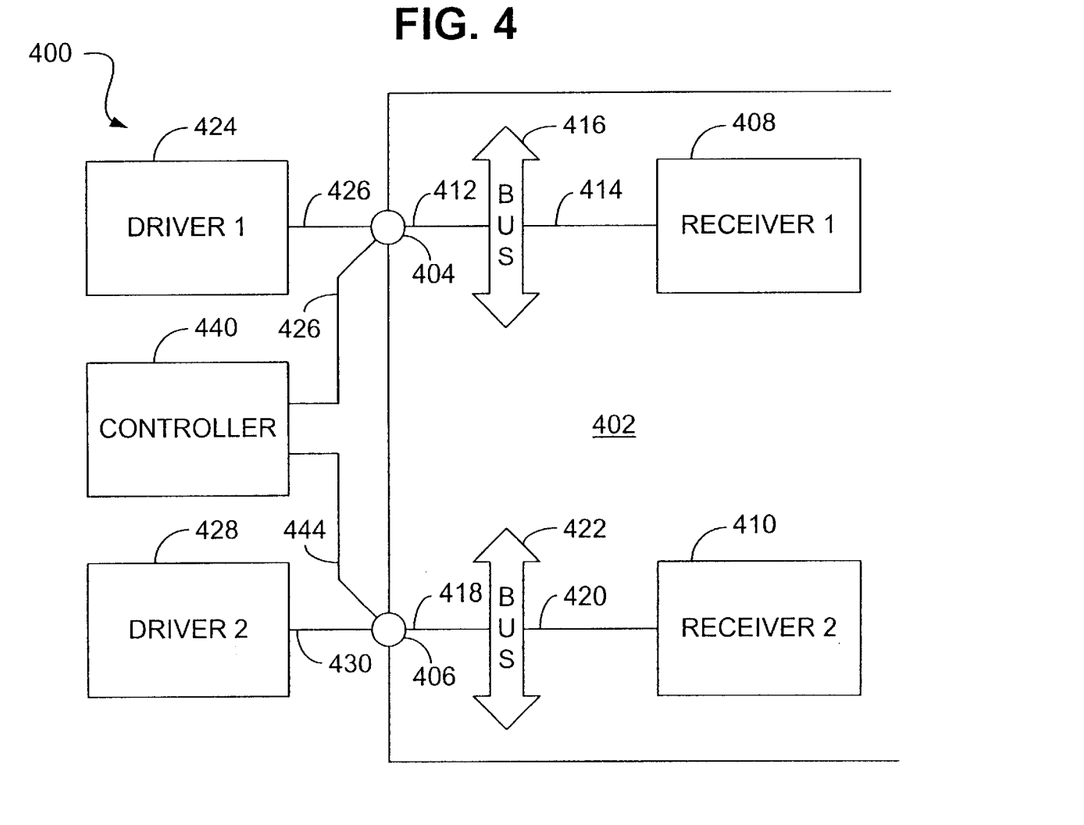
FIG. 4 is a schematic diagram depicting a preferred embodiment of the present invention.

Referring now to FIG. 4, a preferred embodiment of a signal transmission adjusting system 400 will be described.

As depicted therein, IC 402 includes chip pads 404 and 406 which electrically communicate with receivers 408 and 410, respectively.

As is known, chip pads may electrically communicate with components, such as on-chip receivers, by utilizing transmission media of various types and configurations. In FIG. 4, chip pad 404 communicates with receiver 408 via transmission lines 412 and 414 which are interconnected by bus 416, and chip pad 406 electrically communicates with receiver 410 via transmission lines 418 and 420 which are interconnected by bus 422, although various other configurations of transmission media may be utilized and are considered well within the scope of the present invention. Each chip pad also has a driver electrically connected thereto, i.e., driver 1 (424) communicating with chip pad 404 via transmission line 426, and driver 2 (428) communicating with chip 406 via transmission line 430, although various other driver configurations may be utilized and are considered well within the scope of the present invention.

A controller 440 is provided which electrically communicates with chip pad 404 via transmission line 442 and with chip pad 406 via transmission line 444. As described in detail hereinafter, controller 440 is adapted to sample signals propagated along transmission paths of the IC, preferably at the respective chip pads, and adjust various parameters of the signal transmission path and/or respective signals, thereby improving the efficiency of operation of IC 402. Controller 440 may utilize various methods for sampling the signals of the respective signal transmission paths including: (1) integrating over/undervoltage errors (such as the errors depicted in FIG. 2), and then summing the errors to develop a net/average error for each transmission path; (2) sampling signals by using clocked latches over a plurality of cycles in order to digitally reconstruct the signal waveforms and, thereafter, digitally integrating the waveforms to calculate errors; (3) utilizing a clock generator/oscillator which is linked to the main clock, and utilizing the clock generator/oscillator to over-sample the respective signals, and; (4) utilizing dual-event PVT control, such as by using conventional PVT control and local signal sampling, to determine optimal impedance's for the respective transmission paths, among others.

Figure 5:
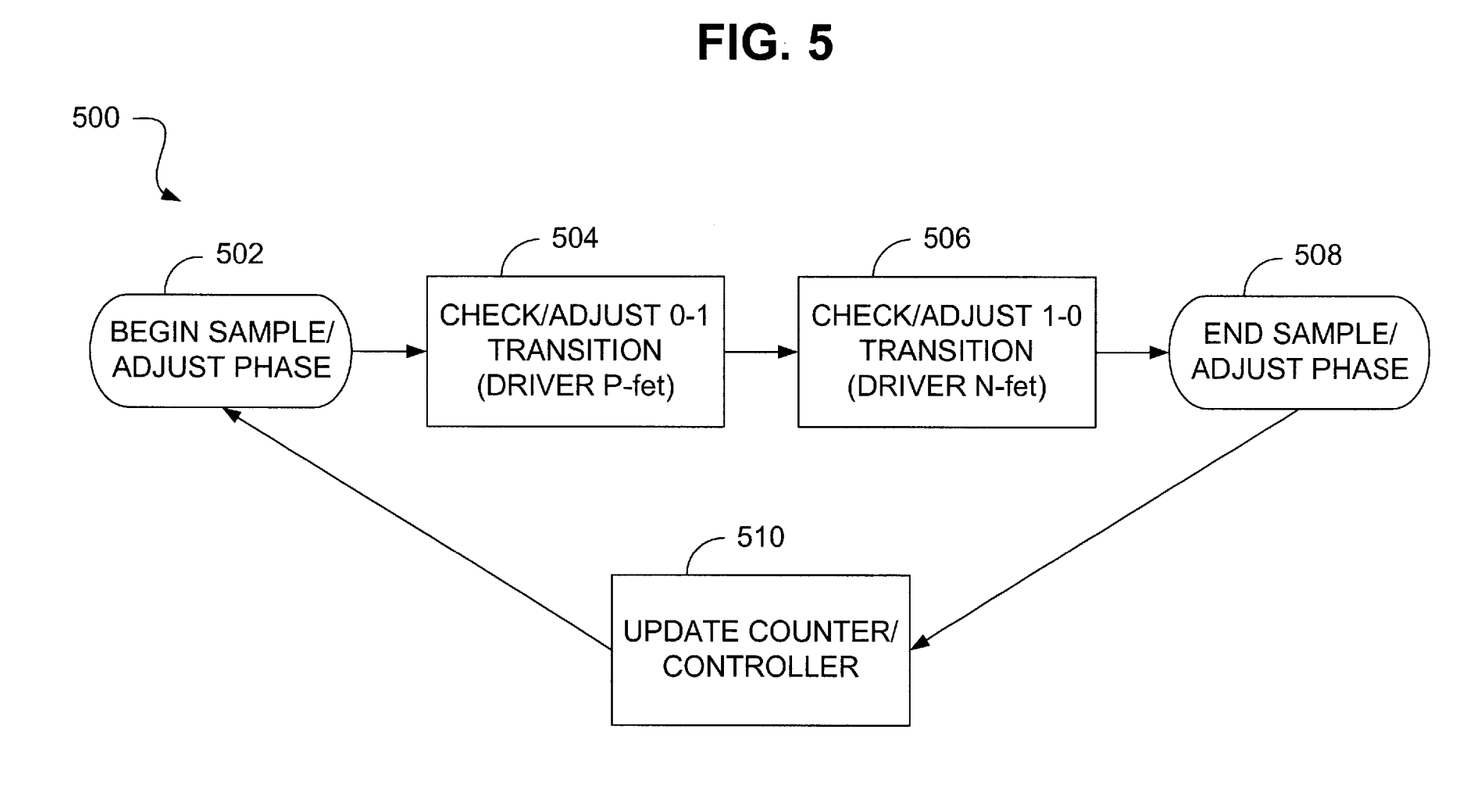
FIG. 5 is a flow diagram depicting a preferred method of the present invention.

Reference will now be made to FIGS. 5–10, wherein the present invention will be described in regard to reducing signal reflections; the present invention will be described in regard to adjusting bus skew thereafter. As depicted in FIG. 5, a preferred method for reducing signal reflections in the transmission media of an IC is presented as a high-level flow diagram. As shown therein, a sample-and-adjust phase begins at block 502 and then proceeds to block 504 where a "0-1" transition, i.e., the P-fet of the driver of the transmission path of interest, is checked and adjusted. The process then preferably proceeds to block 506 where a "1-0" transition, i.e., the N-fet of the driver of the transmission path of interest, is checked and adjusted. After any required adjustments have been made, the sample-and-adjust phase preferably ends at block 508, after which a controller/counter may be updated (block 510). The controller/counter enables the preferred method depicted in blocks 502–508 to occur at an appropriate interval, such as every one million cycles, or whenever the bus is idle, for example. Once a delay for such an appropriate interval has elapsed, the process may proceed back to block 502, and then may proceed as described hereinbefore.

Since mismatches of the type described hereinbefore, which may lead to the propagation of signal reflections, may be accommodated by adjusting parameters of various components and media associated with a signal transmission path and, in particular, may be adjusted by adjusting parameters at either the driver end or receiver end of a particular transmission path, FIGS. 6–10 and their accompanying written description are provided for describing preferred methods for adjusting both drivers and receivers to reduce signal reflections.

Figure 6:
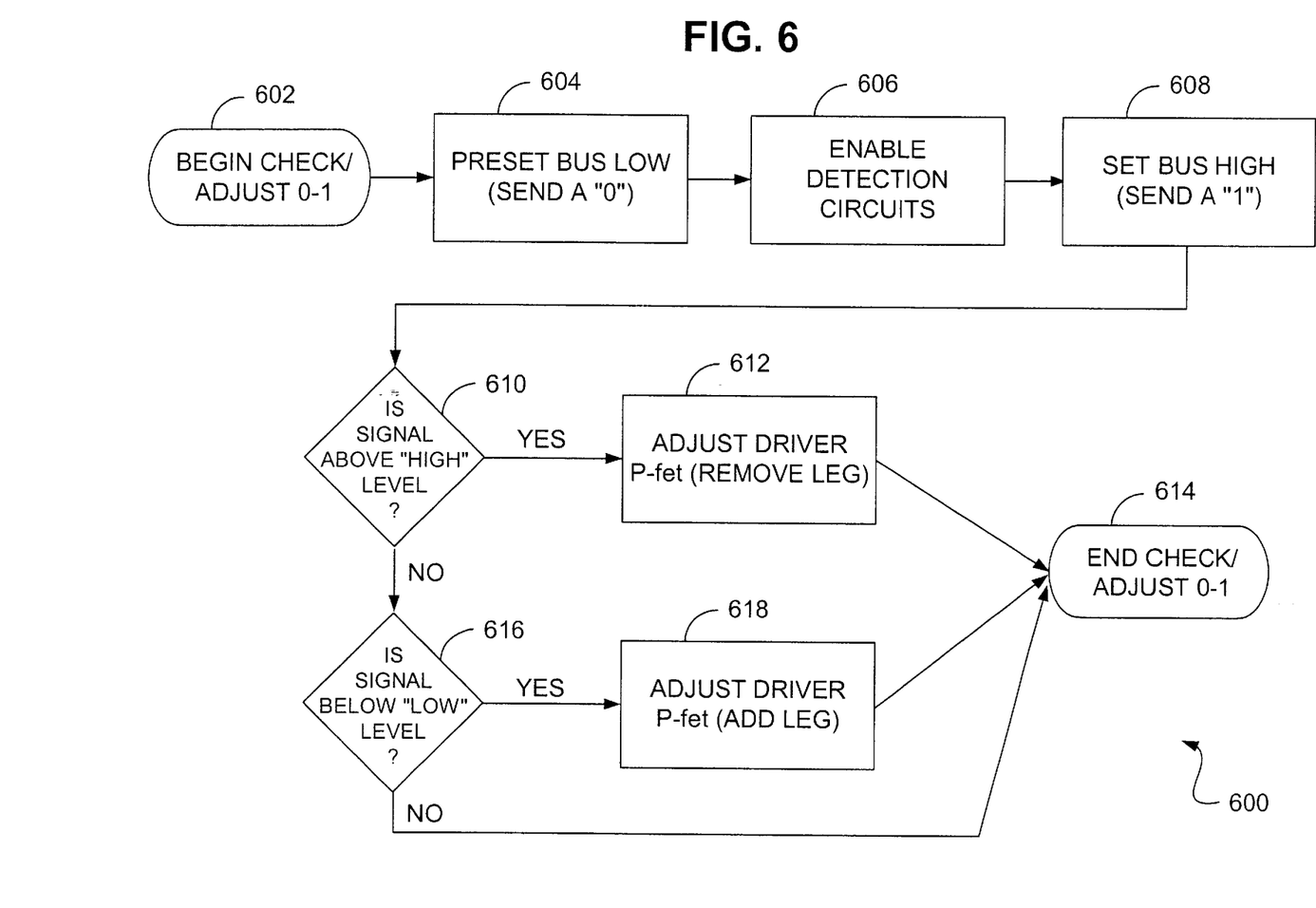
FIG. 6 is a flow diagram depicting a preferred method of the present invention.

In regard to FIG. 6, a preferred method 600 for checking and/or adjusting a "0–1" signal transition, i.e., a driver P-fet, preferably begins at block 602, and then proceeds to block 604 where the appropriate bus is preset low, i.e., a "0" is sent. At block 606, detection circuits, such as level detection circuits or continuous sampling circuits, for example, are enabled, and then the bus is set high, i.e., a "1" is sent (depicted in block 608). At block 610, a determination is made, such as by utilizing a high-level detector of the detection circuit, as to whether the signal, i.e., the "1," is above a predetermined level. If it is determined that the signal was above the predetermined level, the driver P-fet preferably is adjusted, such as by removing a leg of the P-fet, as the detected high signal level typically is indicative of the driver P-fet being too strong.

After adjusting the driver P-fet in block 612, the process may proceed to block 614 where the method 600 ends. If, however, it is determined that the signal, i.e., the "1," was not above the predetermined level, the process may proceed to block 616 where a determination is made, such as by a low-level detector of the detection circuit, as to whether the signal was below a predetermined level. If it is determined that the signal was below the predetermined level, the process preferably proceeds to block 618 where the driver P-fet may be adjusted by adding a leg. After adjusting the driver P-fet, the process may then proceed to block 614, as described hereinbefore. If, however, it is determined, such as in block 616, that the signal did not fall below the predetermined level, the process also may proceed to block 614, as such a determination typically is indicative of the driver P-fet being appropriately sized.

Figure 7:
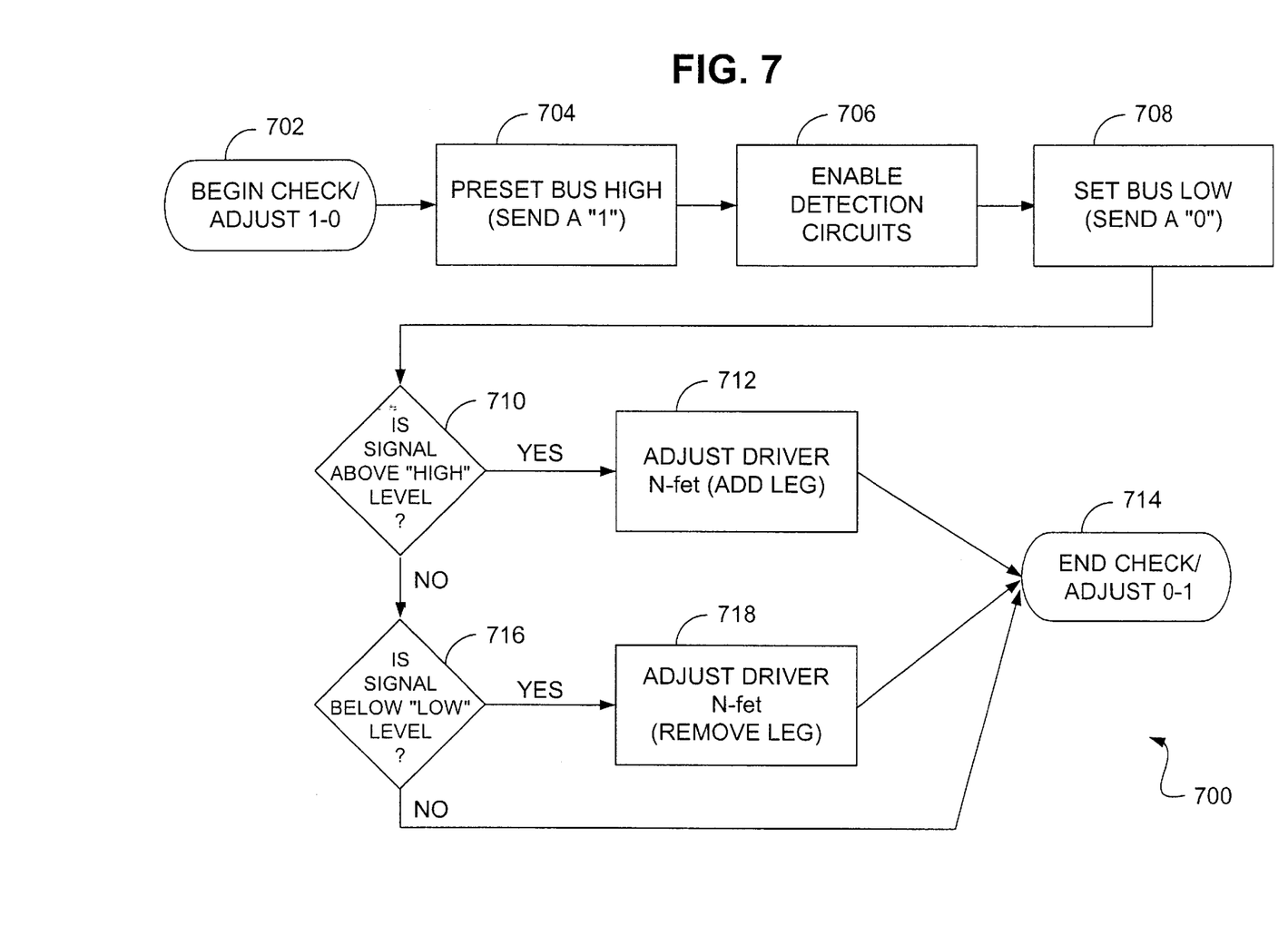
FIG. 7 is a flow diagram depicting a preferred method of the present invention.

Referring now to FIG. 7, a preferred method 700 for checking and/or adjusting a "1–0" signal transition, i.e., a driver N-fet, preferably begins at block 702, and then proceeds to block 704 where the appropriate bus is preset high, i.e., a "1" is sent. At block 706, detection circuits, such as level detection circuits or continuous sampling circuits, for example, are enabled, and then the bus is set low, i.e., a "0" is sent (depicted in block 708). At block 710, a determination is made, such as by utilizing a high-level detector of the detection circuit, as to whether the signal, i.e., the "0," is above a predetermined level. If it is determined that the signal was above the predetermined level, the driver N-fet preferably is adjusted, such as by adding a leg of the N-fet, as the detected high signal level typically is indicative of the driver N-fet being too weak.

After adjusting the driver N-fet in block 712, the process may proceed to block 714 where the method 700 ends. If, however, it is determined that the signal, i.e., the "0," was not above the predetermined level, the process may proceed to block 716 where a determination is made, such as by a low-level detector of the detection circuit, as to whether the signal was below a predetermined level. If it is determined that the signal was below the predetermined level, the process preferably proceeds to block 718 where the driver N-fet may be adjusted by removing a leg. After adjusting the driver N-fet, the process may then proceed to block 714, as described hereinbefore. If, however, it is determined, such as in block 716, that the signal did not fall below the predetermined level, the process also may proceed to block 714, as such a determination typically is indicative of the driver N-fet being appropriately sized.

Figure 8:
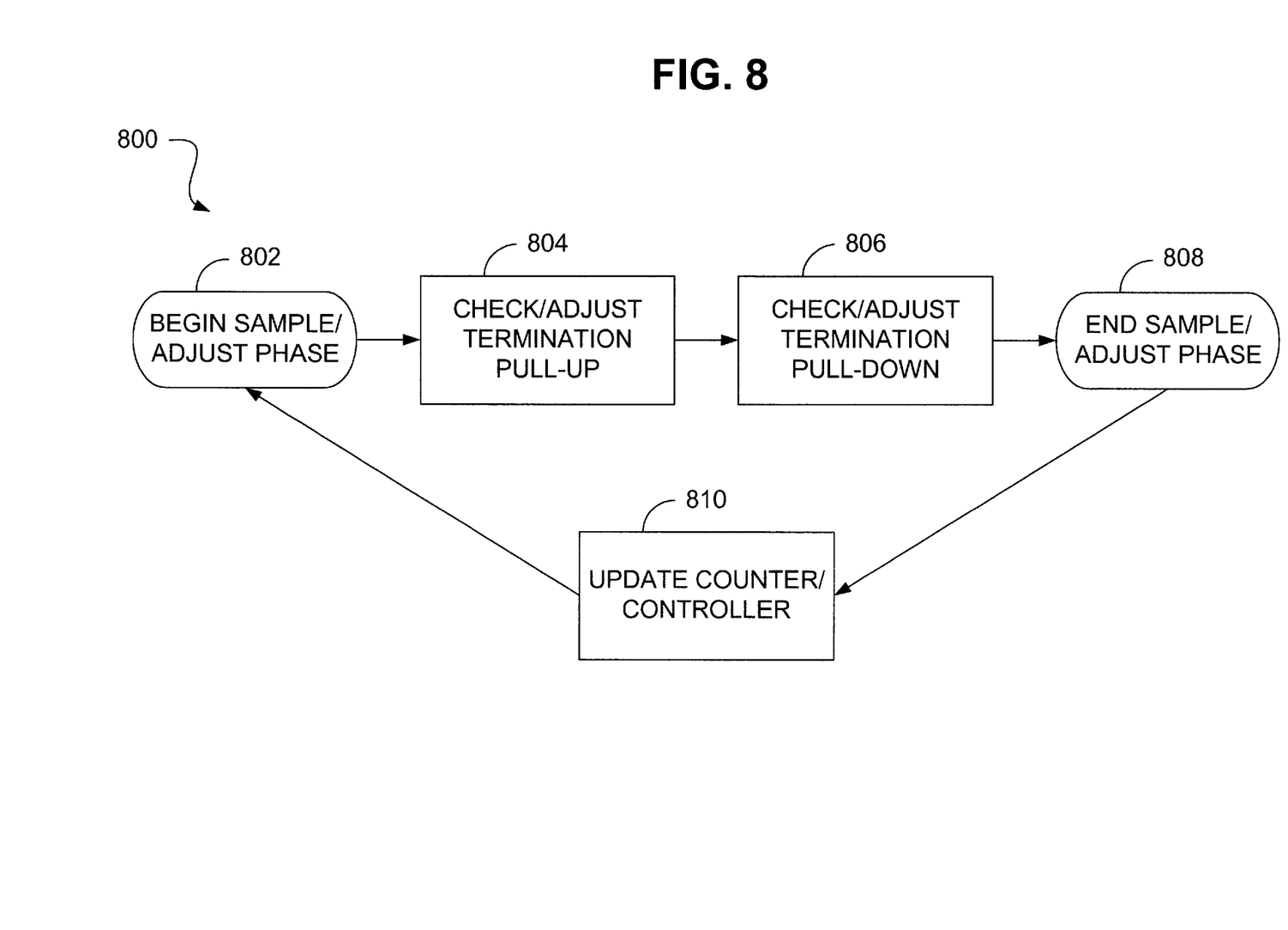
FIG. 8 is a flow diagram depicting a preferred method of the present invention.
Figure 9:
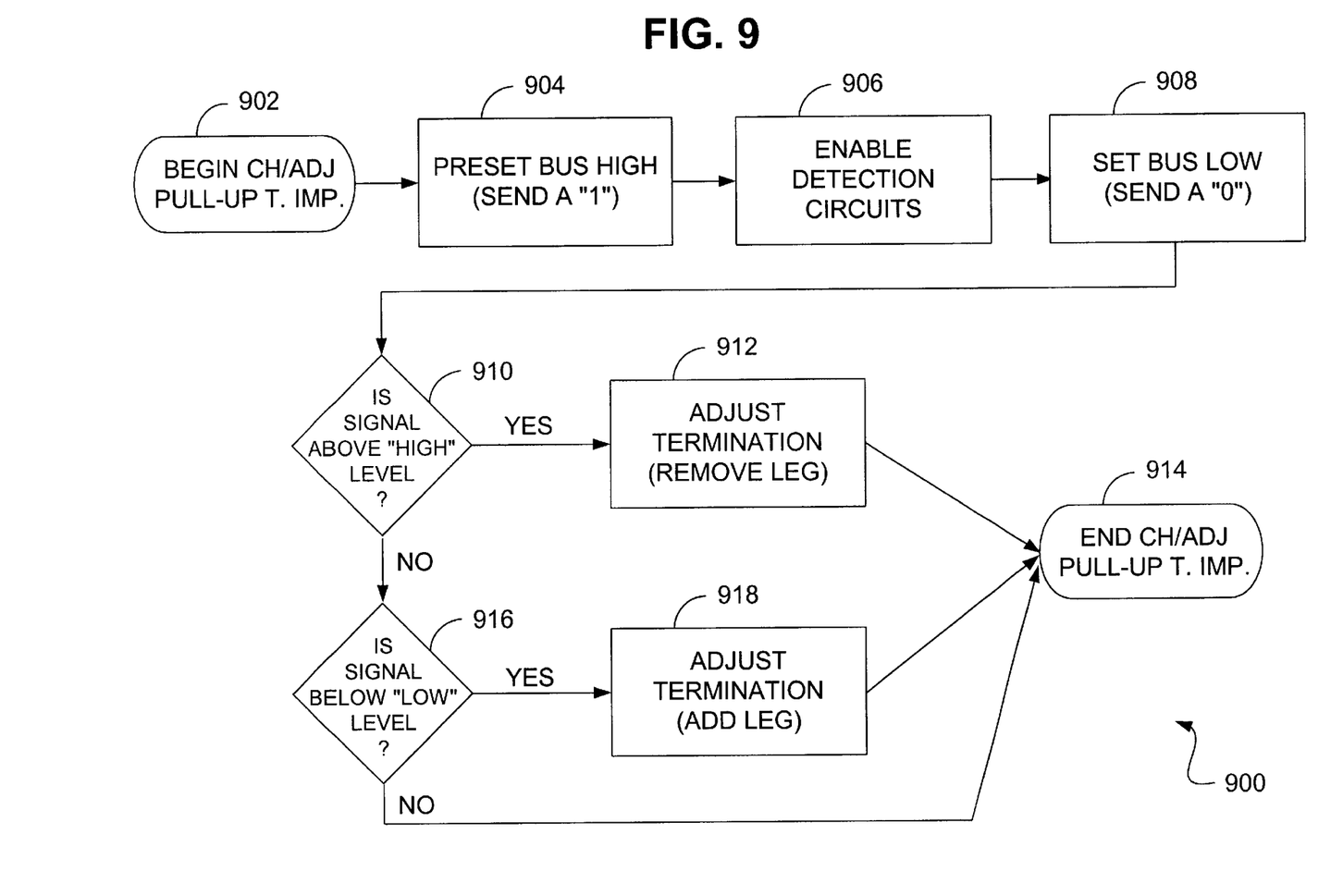
FIG. 9 is a flow diagram depicting a preferred method of the present invention.
Figure 10:
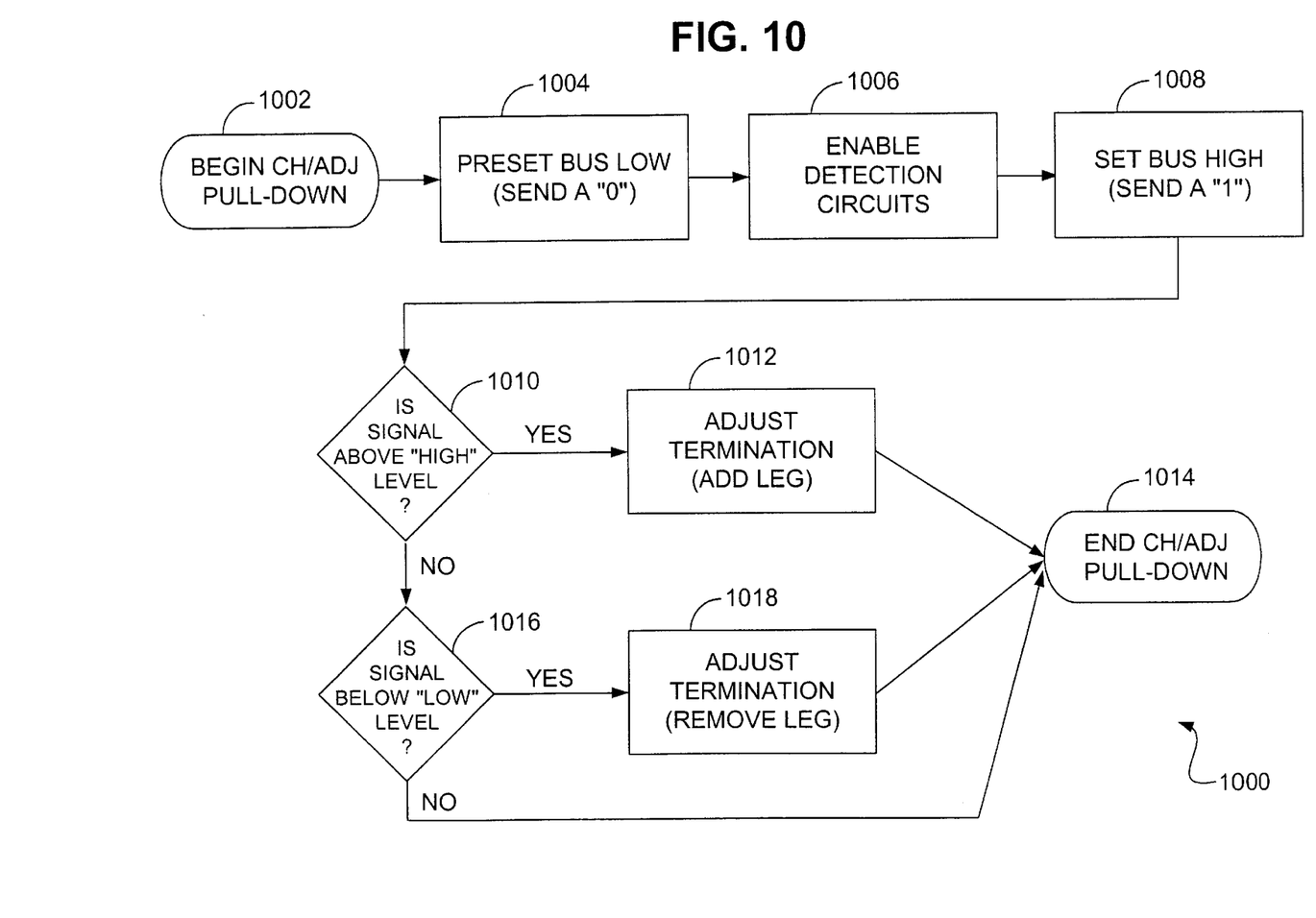
FIG. 10 is a flow diagram depicting a preferred method of the present invention.

Referring now to FIGS. 8–10, preferred methods for reducing signal reflections of the IC will be described in relation to adjusting receiver related components. In this regard, FIG. 8 depicts a preferred method 800 which begins at block 802 and then proceeds to block 804 where pull-up termination impedance of the receiver of the transmission path of interest, is checked and adjusted. The process then preferably proceeds to block 806 where pull-down termination impedance of the receiver of the transmission path of interest, is checked and adjusted. After any required adjustments have been made, the check-and-adjust phase preferably ends at block 808, after which the controller/counter may be updated (block 810). The controller/counter enables the preferred method depicted in blocks 802–808 to occur at an appropriate interval, as described hereinbefore. Once a delay for such an appropriate interval has elapsed, the process may proceed back to block 802, and then may proceed as described hereinbefore.

Referring now to FIG. 9, a preferred method 900 for checking and/or adjusting pull-up termination impedance of a receiver preferably begins at block 902, and then proceeds to block 904 where the appropriate bus is preset high, i.e., a "1" is sent. At block 906, detection circuits, such as level detection circuits or continuous sampling circuits, for example, are enabled, and then the bus is set low, i.e., a "0" is sent (depicted in block 908). At block 910, a determination is made, such as by utilizing a high-level detector of the detection circuit, as to whether the signal, i.e., the "0," is above a predetermined level. If it is determined that the signal was above the predetermined level, the receiver preferably is adjusted, such as by removing a leg of the receiver, as the detected high signal level typically is indicative of the pull-up termination impedance of the receiver being too strong.

After adjusting the receiver in block 912, the process may proceed to block 914 where the method 900 ends. If, however, it is determined that the signal, i.e., the "0," was not above the predetermined level, the process may proceed to block 916 where a determination is made, such as by a low-level detector of the detection circuit, as to whether the signal was below a predetermined level. If it is determined that the signal was below the predetermined level, the process preferably proceeds to block 918 where the receiver may be adjusted, such as by adding a leg. After adjusting the receiver, the process may then proceed to block 914, as described hereinbefore. If, however, it is determined, such as in block 916, that the signal did not fall below the predetermined level, the process also may proceed to block 914, as such a determination typically is indicative of the receiver pull-up termination impedance being appropriately sized.

In regard to FIG. 10, a preferred method 1000 for checking and/or adjusting pulldown termination impedance of a receiver preferably begins at block 1002, and then proceeds to block 1004 where the appropriate bus is preset low, i.e., a "0" is sent. At block 1006, detection circuits, such as level detection circuits or continuous sampling circuits, for example, are enabled, and then the bus is set high, i.e., a "1" is sent (depicted in block 1008). At block 1010, a determination is made, such as by utilizing a high-level detector of the detection circuit, as to whether the signal, i.e., the "1," is above a predetermined level. If it is determined that the signal was above the predetermined level, the receiver preferably is adjusted, such as by adding a leg of the receiver, as the detected high signal level typically is indicative of the pull-down termination impedance of the receiver being too weak.

After adjusting the receiver in block 1012, the process may proceed to block 1014 where the method 1000 ends. If, however, it is determined that the signal, i.e., the "1," was not above the predetermined level, the process may proceed to block 1016 where a determination is made, such as by a low-level detector of the detection circuit, as to whether the signal was below a predetermined level. If it is determined that the signal was below the predetermined level, the process preferably proceeds to block 1018 where the receiver may be adjusted, such as by removing a leg. After adjusting the receiver, the process may then proceed to block 1014, as described hereinbefore. If, however, it is determined, such as in block 1016, that the signal did not fall below the predetermined level, the process also may proceed to block 1014, as such a determination typically is indicative of the receiver pull-down termination impedance being appropriately sized.

As mentioned hereinbefore, some embodiments of the present invention may be adapted to provide desired signal transmission characteristics by adjusting bus skew. Preferably, adjusting of bus skew is accomplished by adjusting line delays associated with each chip pad of an IC. For instance, each chip pad may adjust the delay of its driver, thereby providing a better match to a target line delay for the total bus. So provided, the chip pad signals will tend to converge to a single driver/line delay as seen by other device, thereby reducing the bus skew and increasing performance of the IC.

Figure 11:
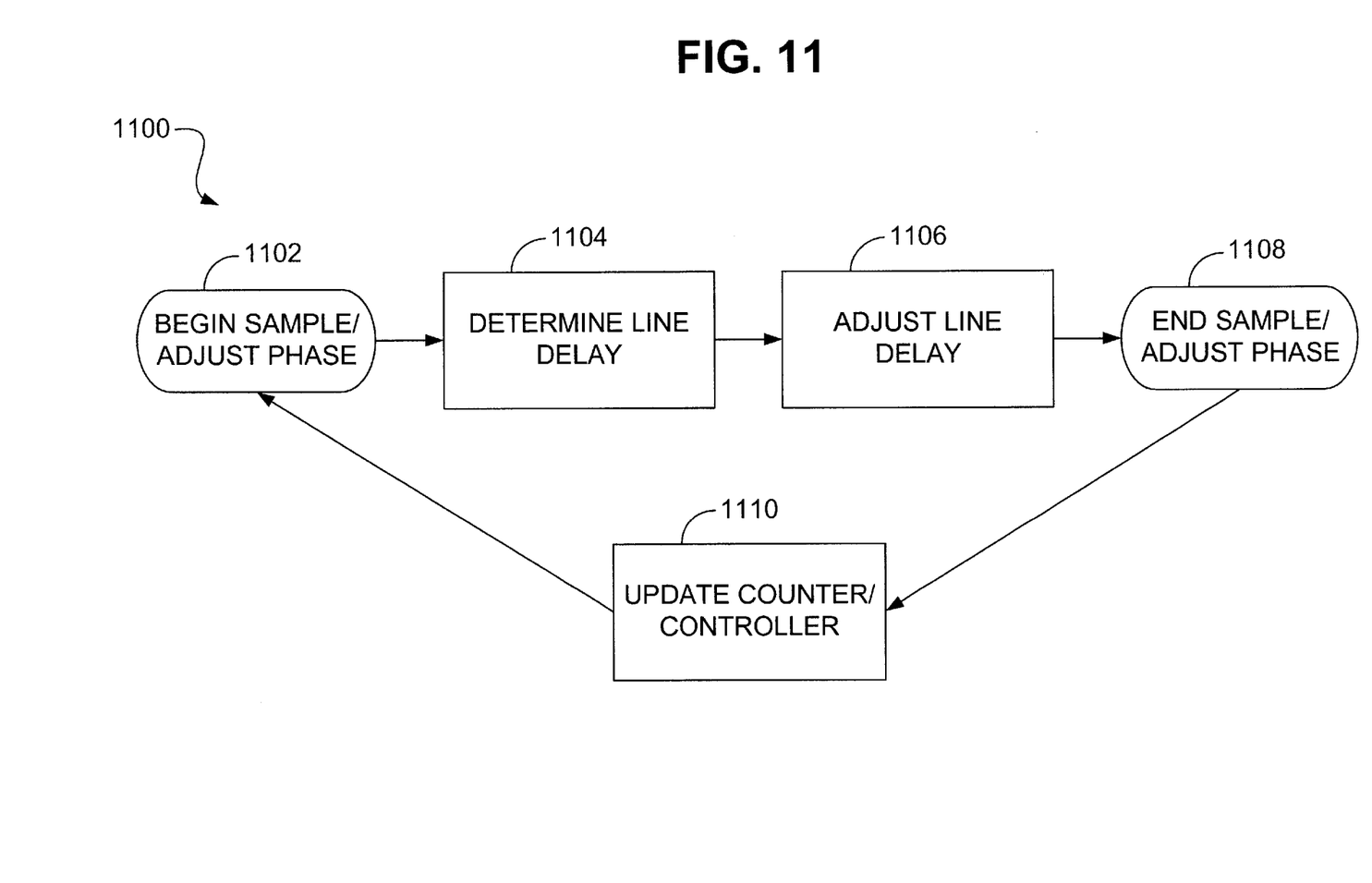
FIG. 11 is a flow diagram depicting a preferred method of the present invention.

As shown in FIG. 11, preferred method 1100 for adjusting bus skew is presented as a high-level flow diagram. As shown therein, a sample-and-adjust phase begins at block 1102 and then proceeds to block 1104 where line delay, i.e., line delay associated with a particular chip pad, is determined. The process then preferably proceeds to block 1106 where the line delay may be adjusted, as required. After any required adjustments have been made, the sample-and-adjust phase preferably ends at block 1 108, after which a controller/counter may be updated (block 1110). The controller/counter enables the preferred method depicted in blocks 1102–1108 to occur at an appropriate interval, such as every one million cycles, or whenever the bus is idle, for example. Once a delay for an appropriate interval has elapsed, the process may proceed back to block 1102, and then may proceed as described hereinbefore.

Various methods for determining line delay may be utilized. For instance, a signal may be driven, such as at a chip pad, and then sampled for reflections by utilizing clocked latches and counters so that individual delays and variations may be determined.

Additionally, after driving a signal, signal reflections may be measured, as described earlier, so that a ratio of reflected energy to transmitted energy may be computed. The ratio then may be used to determine the impedance mismatches between the driver, receiver termination and transmission line.

The foregoing description has been presented for purposes of illustration and description. It is not intended to be exhaustive or to limit the invention to the precise forms disclosed. Obvious modifications or variations are possible in light of the above teachings. The embodiment or embodiments discussed, however, were chosen and described to provide the best illustration of the principles of the invention and its practical application to thereby enable one of ordinary skill in the art to utilize the invention in various embodiments and with various modifications as are suited to the particular use contemplated. All such modifications and variations, are within the scope of the invention as determined by the appended claims when interpreted in accordance with the breadth to which they are fairly and legally entitled.

What is claimed is:

1. A system for adjusting signals provided-along signal transmission paths, said system comprising:

an integrated circuit having a first chip pad, a first receiver, and process, voltage and temperature (PVT) controls, said first chip pad electrically communicating with said first receiver, said first chip pad and said first receiver forming at least a portion of a first signal transmission path, said PVT controls being configured to adjust driver delay and receiver impedance based upon on-chip conditions of said integrated circuit;

a controller electrically communicating with said first chip pad, said controller being configured to sample a first signal corresponding to said first chip pad and adjust the first signal such that at least one of the group consisting of: line delay and signal reflections associated with the first signal is modified, whereby performance of the integrated circuit is improved.

2. The system of claim 1, wherein said controller is configured to reduce the signal reflections of the first signal.

3. The system of claim 1, wherein the signal transmission path has a target bus delay and an actual line delay associated therewith, and wherein said controller is configured to adjust the actual line delay.

4. The system of claim 1, wherein said first receiver has a pull-down termination impedance;

wherein the first signal corresponds to a bus of said integrated circuit transitioning from low to high; and wherein said controller is configured to determine whether the first signal exceeded a predetermined high level when said bus transitioned from low to high such that, if the first signal exceeded the predetermined high level, said controller adjusts said receiver by adding a leg of the pull-down termination impedance.

5. The system of claim 1, wherein said first receiver has a pull-up termination impedance;

wherein the first signal corresponds to a bus of said integrated circuit transitioning from low to high; and wherein said controller is configured to determine whether the first signal exceeded a predetermined high level when said bus transitioned from low to high such that, if the first signal exceeded the predetermined high level, said controller adjusts said receiver by removing a leg of said pull-up termination impedance.

6. The system of claim 1, wherein said first receiver has a pull-down termination impedance;

wherein the first signal corresponds to a bus of said integrated circuit transitioning from high to low; and wherein said controller is configured to determine whether the first signal reached a predetermined low level when said bus transitioned from high to low such that, if the first signal failed to reach the predetermined low level, said controller adjusts said receiver by removing a leg of said pull-down termination impedance.

7. The system of claim 1, wherein said first receiver has a pull-up termination impedance;

wherein the first signal corresponds to a bus of said integrated circuit transitioning from high to low; and wherein said controller is configured to determine whether the first signal reached a predetermined low level when said bus transitioned from high to low such that, if the first signal failed to reach the predetermined low level, said controller adjusts said receiver by adding a leg of said pull-up termination impedance.

8. The system of claim 1, further comprising:
a driver electrically communicating with said first chip pad, said driver being adapted to provide the first signal to said first chip pad.

9. The system of claim 1, further comprising:
means for providing the first signal to said first chip pad.

10. A method for adjusting signals, each of the signals corresponding to a signal transmission path having a line delay and signal reflections associated therewith, at least a portion of each signal transmission path being provided by an integrated circuit, the signal transmission path including a driver external to the integrated circuit and a receiver internal to the integrated circuit, the integrated circuit having chip pads, each of the chip pads corresponding to one of the signal transmission paths, said method comprising the steps of:

sampling at least one of the signals at the chip pad corresponding thereto to detect signal reflections by:
presetting a bus of the signal transmission path low;
setting the bus high; and
evaluating the signal in response to the bus transitioning from low to high to determine whether the signal exceeded a predetermined high level; and if the signal exceeded the predetermined high level, adjusting the driver to adjust the at least one of the signals at the chip pad such that at least one of the group consisting of: line delay and signal reflections is modified, whereby performance of the integrated circuit is improved compared with the performance of the integrated circuit prior to the step of adjusting, wherein the driver has a P-fet; and wherein the step of adjusting comprises removing a leg of the P-fet if the signal exceeded the predetermined high level.

11. The method of claim 10, wherein the signal transmission path has a target bus delay associated therewith, and wherein the step of adjusting comprises the step of adjusting the line delay of the signal transmission path such that the line delay converges with the target bus delay.

12. A method for adjusting signals, each of the signals corresponding to a signal transmission path having a line delay and signal reflections associated therewith, at least a portion of each signal transmission path being provided by an integrated circuit, the signal transmission path including a driver external to the integrated circuit and a receiver internal to the integrated circuit, the integrated circuit having chip pads, each of the chip pads corresponding to one of the signal transmission paths, said method comprising the steps of:

sampling at least one of the signals at the chip pad corresponding thereto to detect signal reflections by:
presetting a bus of the signal transmission path low;
setting the bus high; and
evaluating the signal in response to the bus transitioning from low to high to determine whether the signal exceeded a predetermined high level; and if the signal exceeded the predetermined high level, adjusting the driver to adjust the at least one of the signals at the chip pad such that at least one of the group consisting of: line delay and signal reflections is modified, whereby performance of the integrated circuit is improved compared with the performance of the integrated circuit prior to the step of adjusting, wherein the driver has an N-fet; and wherein the step of adjusting comprises adding a leg of the N-fet if the signal exceeded the predetermined high level.

13. A method for adjusting signals, each of the signals corresponding to a signal transmission path having a line delay and signal reflections associated therewith, at least a portion of each signal transmission path being provided by an integrated circuit, the signal transmission path including a driver external to the integrated circuit and a receiver internal to the integrated circuit, the integrated circuit having chip pads, each of the chip pads corresponding to one of the signal transmission paths, said method comprising the steps of:

sampling at least one of the signals at the chip pad corresponding thereto to detect signal reflections by:
presetting a bus of the signal transmission path low;
setting the bus high; and
evaluating the signal in response to the bus transitioning from low to high to determine whether the signal exceeded a predetermined high level; and if the signal exceeded the predetermined high level, adjusting the receiver such that at least one of the group consisting of: line delay and signal reflections is modified, whereby performance of the integrated circuit is improved compared with the performance of the integrated circuit prior to the step of adjusting, wherein the receiver has a pull-down termination impedance; and wherein the step of adjusting comprises adding a leg of the pull-down termination impedance if the signal exceeded the predetermined high level.

14. The method of claim 13 wherein the signal transmission path has a target bus delay associated therewith, and wherein the step of adjusting comprises adjusting the line delay of the signal transmission path such that the line delay converges with the target bus delay.

15. A method for adjusting signals, each of the signals corresponding to a signal transmission path having a line delay and signal reflections associated therewith, at least a portion of each signal transmission path being provided by an integrated circuit, the signal transmission path including a driver external to the integrated circuit and a receiver internal to the integrated circuit, the integrated circuit having chip pads, each of the chip pads corresponding to one of the signal transmission paths, said method comprising the steps of:

sampling at least one of the signals at the chip pad corresponding thereto to detect signal reflections by:
presetting a bus of the signal transmission path low;
setting the bus high; and
evaluating the signal in response to the bus transitioning from low to high to determine whether the signal exceeded a predetermined high level; and if the signal exceeded the predetermined high level, adjusting the receiver such that at least one of the group consisting of: line delay and signal reflections is modified, whereby performance of the integrated circuit is improved compared with the performance of the integrated circuit prior to the step of adjusting, wherein the receiver has a pull-up termination impedance; and wherein the step of adjusting comprises removing a leg of the pull-up termination impedance if the signal exceeded the predetermined high level.

16. A method for adjusting signals, each of the signals corresponding to a signal transmission path having a line delay and signal reflections associated therewith, at least a portion of each signal transmission path being provided by an integrated circuit, the signal transmission path including a driver external to the integrated circuit and a receiver internal to the integrated circuit, the integrated circuit having chip pads, each of the chip pads corresponding to one of the signal transmission paths, said method comprising the steps of:

sampling at least one of the signals at the chip pad corresponding thereto to detect signal reflections by:
presetting a bus of the signal transmission path high;
setting the bus low; and
evaluating the signal in response to the bus transitioning from high to low to determine whether the signal reached a predetermined low level; and if the signal reached the predetermined low level, adjusting the driver to adjust the at least one of the signals at the chip pad such that at least one of the group consisting of: line delay and signal reflections is modified, whereby performance of the integrated circuit is improved compared with the performance of the integrated circuit prior to the step of adjusting, wherein the driver has a P-fet; and wherein the step of adjusting comprises adding a leg of the P-fet if the signal failed to reach the predetermined low level.

17. A method for adjusting signals, each of the signals corresponding to a signal transmission path having a line delay and signal reflections associated therewith, at least a portion of each signal transmission path being provided by an integrated circuit, the signal transmission path including a driver external to the integrated circuit and a receiver internal to the integrated circuit, the integrated circuit having chip pads, each of the chip pads corresponding to one of the signal transmission paths, said method comprising the steps of:

sampling at least one of the signals at the chip pad corresponding thereto to detect signal reflections by:
presetting a bus of the signal transmission path high;
setting the bus low; and
evaluating the signal in response to the bus transitioning from high to low to determine whether the signal reached a predetermined low level; and if the signal reached the predetermined low level, adjusting the driver to adjust the at least one of the signals at the chip pad such that at least one of the group consisting of: line delay and signal reflections is modified, whereby performance of the integrated circuit is improved compared with the performance of the integrated circuit prior to the step of adjusting, wherein the driver has an N-fet; and wherein the step of adjusting comprises removing a leg of the N-fet if the signal failed to reach the predetermined low level.

18. The method of claim 17, wherein the signal transmission path has a target bus delay associated therewith, and wherein the step of adjusting comprises adjusting the line delay of the signal transmission path such that the line delay converges with the target bus delay.

19. A method for adjusting signals, each of the signals corresponding to a signal transmission path having a line delay and signal reflections associated therewith, at least a portion of each signal transmission path being provided by an integrated circuit, the signal transmission path including a driver external to the integrated circuit and a receiver internal to the integrated circuit, the integrated circuit having chip pads, each of the chip pads corresponding to one of the signal transmission paths, said method comprising the steps of:

sampling at least one of the signals at the chip pad corresponding thereto to detect signal reflections by:
presetting a bus of the signal transmission path high;
setting the bus low; and
evaluating the signal in response to the bus transitioning from high to low to determine whether the signal reached a predetermined low level; and if the signal reached the predetermined low level, adjusting the receiver such that at least one of the group consisting of: line delay and signal reflections is modified, whereby performance of the integrated circuit is improved as compared with the performance of the integrated circuit prior to the step of adjusting, wherein the receiver has a pull-down termination impedance; and wherein the step of adjusting comprises removing a leg of the pull-down termination impedance if the signal failed to reach the predetermined low level.

20. A method for adjusting signals, each of the signals corresponding to a signal transmission path having a line delay and signal reflections associated therewith, at least a portion of each signal transmission path being provided by an integrated circuit, the signal transmission path including a driver external to the integrated circuit and a receiver internal to the integrated circuit, the integrated circuit having chip pads, each of the chip pads corresponding to one of the signal transmission paths, said method comprising the steps of:

sampling at least one of the signals at the chip pad corresponding thereto to detect signal reflections by:
presetting a bus of the signal transmission path high;
setting the bus low; and
evaluating the signal in response to the bus transitioning from high to low to determine whether the signal reached a predetermined low level; and if the signal reached the predetermined low level, adjusting the receiver such that at least one of the group consisting of: line delay and signal reflections is modified, whereby performance of the integrated circuit is improved as compared with the performance of the integrated circuit prior to the step of adjusting, wherein the receiver has a pull-up termination impedance; and wherein the step of adjusting comprises adding a leg of the pull-up termination impedance if the signal failed to reach the predetermined low level.

21. The method of claim 20, wherein the signal transmission path has a target bus delay associated therewith, and wherein the step of adjusting comprises adjusting the line delay of the signal transmission path such that the line delay converges.

* * * * *